United States Patent
Stockstad et al.

(10) Patent No.: US 6,703,894 B1
(45) Date of Patent: Mar. 9, 2004

(54) BASEBAND FILTER FOR RECEIVERS

(75) Inventors: Troy L. Stockstad, Chandler, AZ (US); Klaas Wortel, Phoenix, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 10/341,158

(22) Filed: Jan. 13, 2003

(51) Int. Cl.[7] .................................................. H03B 1/00
(52) U.S. Cl. ..................... 327/552; 327/307; 327/337
(58) Field of Search ............................. 327/552, 554, 327/558, 559, 337, 307

(56) References Cited

U.S. PATENT DOCUMENTS 6,313,685 B1 * 11/2001 Rabii ........................... 327/307
6,317,064 B1 * 11/2001 Ferrer et al. .................. 341/118
6,429,733 B1 *  8/2002 Pagliolo et al. ............. 327/552
2003/0098734 A1 *  5/2003 Herdey et al. ............... 327/307

* cited by examiner

*Primary Examiner*—Terry D. Cunningham
*Assistant Examiner*—Quan Tra
(74) *Attorney, Agent, or Firm*—Meyertons Hood Kivlin Kowert & Goetzel, P.C.; Jeffrey C. Hood

(57) ABSTRACT

A filter circuit. In one embodiment, the filter circuit includes a continuous time (CT) filter, a switched capacitor (SWC) filter, and an SWC integrator. The CT filter is coupled to receive an input signal from an external source. The CT filter may be a low-pass filter. The SWC filter is coupled to receive an output signal from the CT filter, and provide an output information signal. The SWC filter may also be a low pass filter. A feedback loop may be present between the output of the SWC filter and the input of the CT filter. The SWC integrator samples the output signal from the SWC filter and provides an output signal to the CT filter. The output signal is combined with the input signal to the CT filter. A D.C. offset may be substantially removed from the information signal provided by the output of the SWC filter.

20 Claims, 7 Drawing Sheets

R's implemented with linear FETs

C's implemented with FETs in strong inversion

BASEBAND FILTER FOR RECEIVERS

FIELD OF THE INVENTION

This invention relates to receiver circuits, and more particularly, to filter circuits within a receiver.

DESCRIPTION OF THE RELATED ART

In recent years, the use of direct conversion receivers has begun to replace the use of heterodyne receivers in various types of wireless devices. Direct conversion receivers eliminate the need for an intermediate frequency (IF) conversion before converting a signal to its baseband frequency. Instead, a direct conversion receiver converts a received radio frequency (RF) signal directly to its baseband frequency.

One problem with many radio receiver circuits, including direct conversion receivers, is the presence of a DC (direct current) offset that may be present in the information signal output by the receiver. If the DC offset is large enough, it may hinder or altogether prevent the recovery of information carried on the received RF signal. For example, in FM receivers, it is important that the zero-crossing of an information signal not be obscured by a DC offset in the information signal. FIG. 1A illustrates an information signal without any DC offset. In this particular example, the information signal is a series of sine waves, which represent a logic 1 or a logic 0. When the information contained in the signal transitions from a logic 1 to a logic 0, the phase of the sine wave may shift by 180 degrees. In order to detect this phase shift, it is important that the signal pass through the zero crossing shown in the drawing. In FIG. 1B, a similar information signal with a substantial DC offset is shown. In this particular example, the information signal does not pass through the zero crossing due to the DC offset. Thus, the information present in the signal may not be recovered.

Rejection of DC offsets in information signals may be performed by filters having a low-frequency zero (in the filter transfer function). The zero must be at a frequency low enough to prevent rejection of the desired information signal. Various methods may be employed to accomplish the rejection of any DC offset present. In some implementations, a DC offset may be stored when the receiver is not in use, and this DC offset may be subtracted from the information signal when the receiver is in use. Digital signal processing (DSP) techniques may also be employed. AC (alternating current) coupling methods, which use large decoupling capacitors in series with the baseband filters, may be used in some implementations. Each of these methods has certain disadvantages. Receiver circuits which store the DC offset and subtract it as an error signal may not be able to account for a dynamically shifting DC offset. DSP solutions may require significant processing capability, and may consume more power than is desirable, particularly for portable devices. AC coupled circuits may require large capacitors that may not be practically integrated, which then requires external components that increase component count and cost.

SUMMARY OF THE INVENTION

A filter circuit is disclosed. In one embodiment, the filter circuit includes a continuous time (CT) filter, a switched capacitor (SWC) filter, and an SWC integrator. The CT filter is coupled to receive an input signal from an external source (e.g., a down conversion mixer in a direct conversion receiver). The CT filter may be a low-pass filter. The SWC filter is coupled to receive an output signal from the CT filter, and provide an output information signal. In one embodiment, the output signal may be a continuous signal. The SWC filter may also be a low pass filter. An SWC integrated may be coupled in a feedback loop between the output of the SWC filter and the input of the CT filter. The SWC integrator may sample the output signal from the SWC filter and provide an output signal to the input of the CT filter. The output signal may be combined with the input signal to the CT filter. A D.C. (direct current) offset may be substantially removed from the information signal provided by the output of the SWC filter.

A method for rejecting a DC offset in a filter circuit includes providing an input signal, performing a continuous time filtering function, and providing an output signal. The method may then perform an SWC filtering function to provide an information signal as an output. The method may further include sampling the information signal, performing an SWC integrating function, and providing an output signal to the input of a CT filter. The output signal from the SWC filtering function may be combined with the input signal to the CT filtering function. A DC offset component may be substantially removed from the information signal responsive to combining the input signal and the continuous output signal.

BRIEF DESCRIPTION OF THE DRAWINGS

Other aspects of the invention will become apparent upon reading the following detailed description and upon reference to the accompanying drawings in which.

Figure 1A:
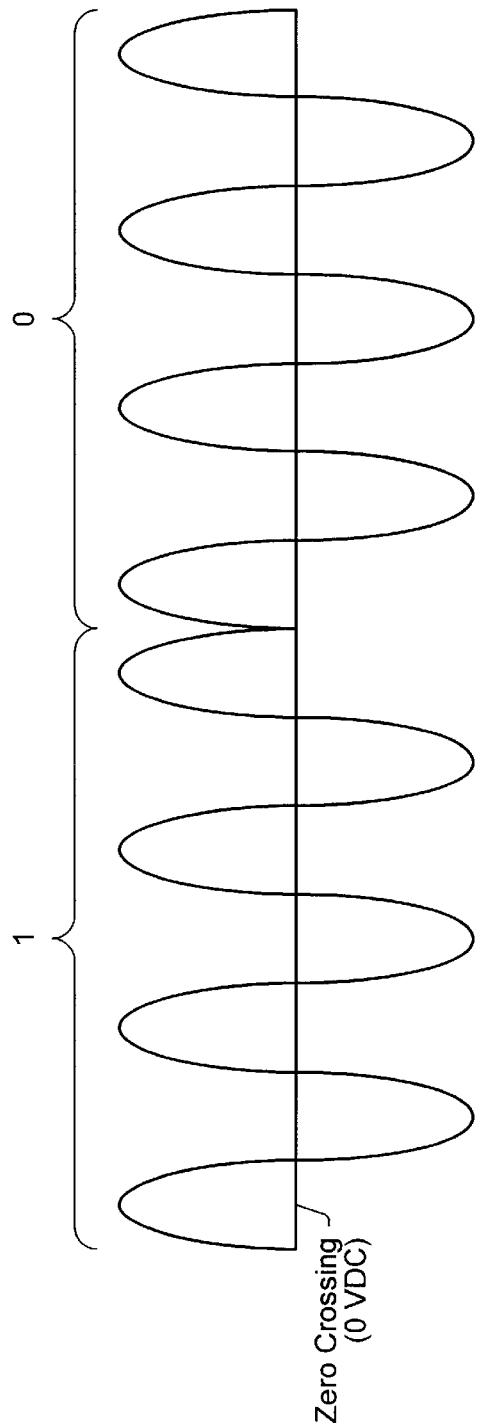
FIG. 1A (Prior Art) is a drawing of one embodiment of a modulation scheme for transmitting binary data.
Figure 1B:
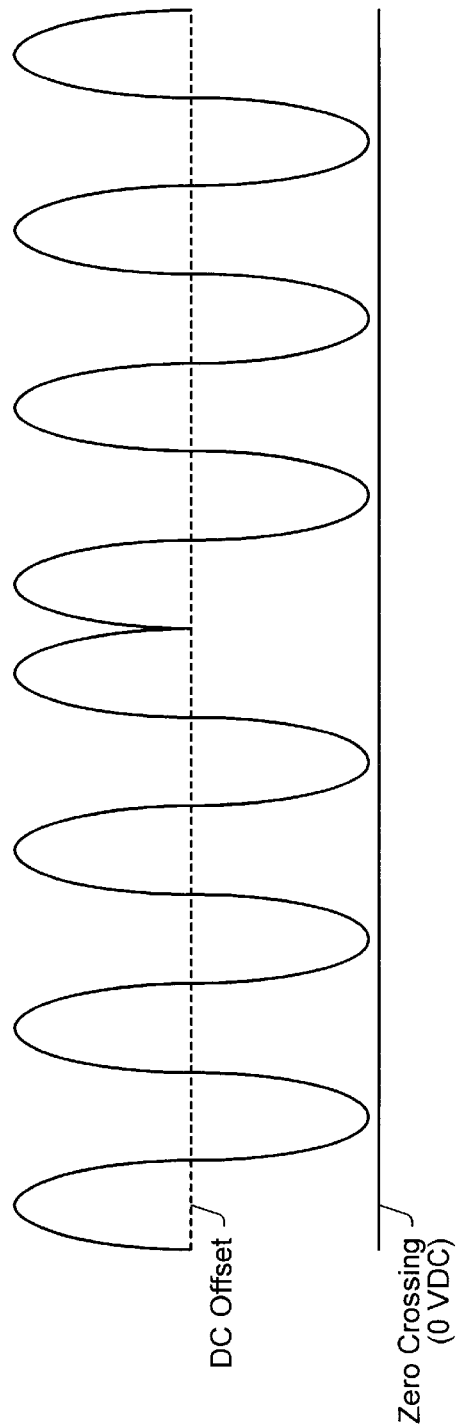
FIG. 1B (Prior Art) is a drawing illustrating the effect of a DC offset on the modulation scheme of FIG. 1A.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
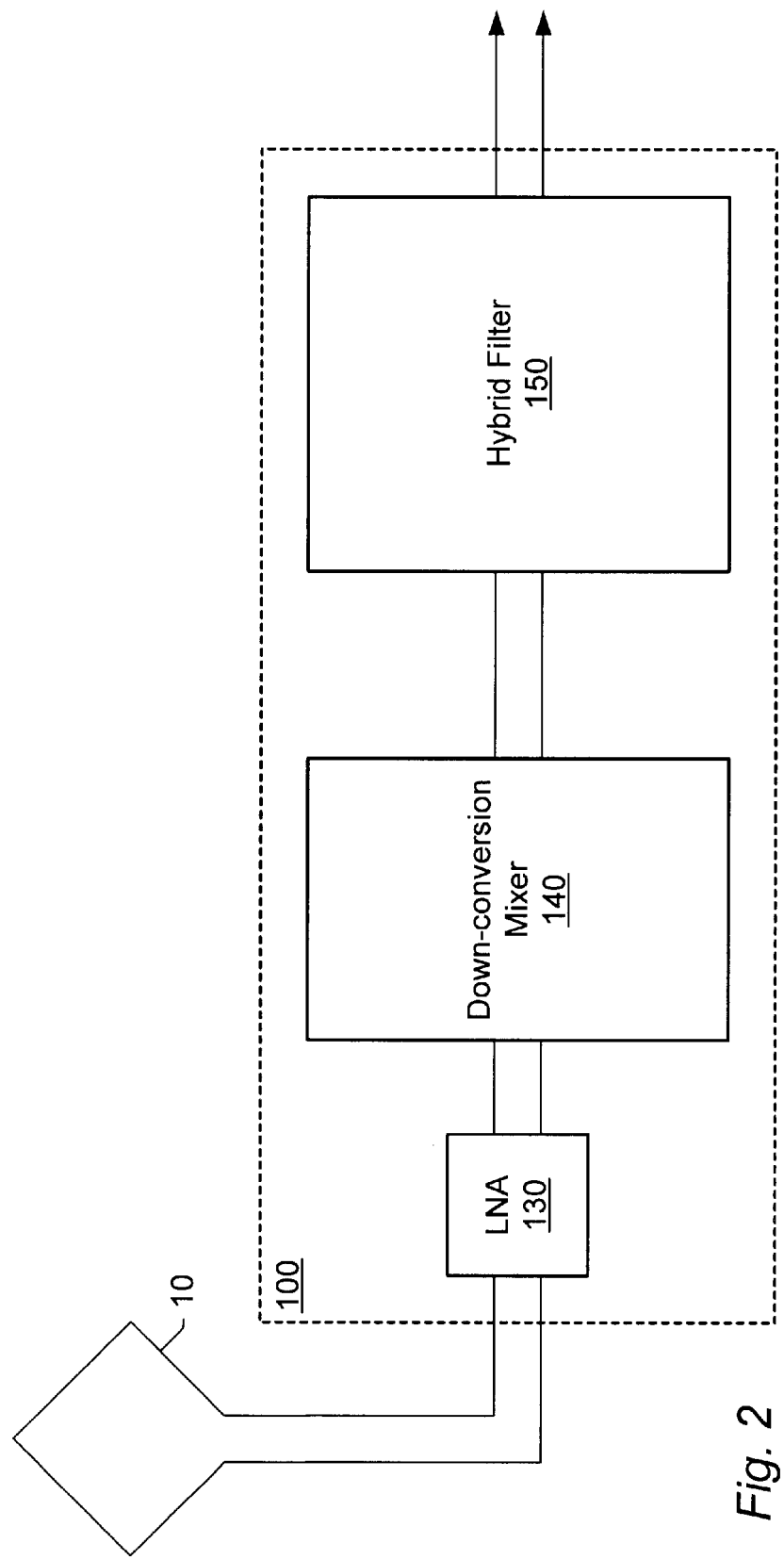
FIG. 2 is a block diagram of one embodiment of a receiver circuit utilizing a hybrid filter circuit.

Turning now to FIG. 2, a block diagram of one embodiment of a receiver circuit utilizing a hybrid filter circuit is shown. In the embodiment shown, receiver circuit 100 is a direct conversion receiver, although other embodiments are possible and contemplated. Direct conversion receivers may receive a signal at radio frequency (RF) and directly convert the signal to its baseband frequency, instead of first converting the RF signal to an intermediate frequency. In one embodiment, receiver circuit 100 may be implemented on a single die (i.e. integrated circuit). Various embodiments of receiver circuit 100 may be implemented for virtually any type of modulation scheme, such as quadrature modulation, TDMA (time division multiple access) or FSK (frequency shift keying) modulation.

Receiver circuit 100 is coupled to antenna 10. Airborne electromagnetic signals may be received through antenna 10. In the embodiment shown, antenna 10 is coupled to provide a differential signal input into low noise amplifier (LNA) 130. Other embodiments wherein the signal input to LNA 130 is a single-ended signal are possible and contemplated. LNA 130 may amplify the received signal to a level sufficient for mixing and down conversion.

Down-conversion mixer 140 may receive the amplified signal from LNA 130. Down-conversion mixer 140 may include an oscillator which produces a signal having a frequency that is at the RF band that receiver-circuit 100 is to de-modulate. The signal produced by the oscillator may be mixed with the received signal, thereby producing a signal at the baseband frequency. The baseband signal may then be output by down-conversion mixer 140.

Hybrid filter 150 may receive the baseband signal that is provided from down-conversion mixer 140. Hybrid filter 150 may be a combination of a continuous time (CT) filter and a switched capacitor (SWC) filter, and may also include an SWC integrator. Hybrid filter 150 may be designed to substantially eliminate any D.C. (direct current) offset from the baseband signal. The structure of this particular embodiment may allow the reduction or elimination of any D.C. offset without the need for large capacitors that may be required in other types of filters. Eliminating or reducing the need for large capacitors may result in significant die area savings on an integrated circuit upon which hybrid filter 150 is implemented.

An information signal may be provided by the output of hybrid filter circuit 150. The information signal may take various forms, such as an audio signal for a wireless phone or a representation of digital data for other types of portable wireless devices. For example, the information signal may represent digital data for a wireless peripheral device, such as a wireless mouse or wireless keyboard, or voice data for a cordless telephone or a cellular telephone.

Figure 3:
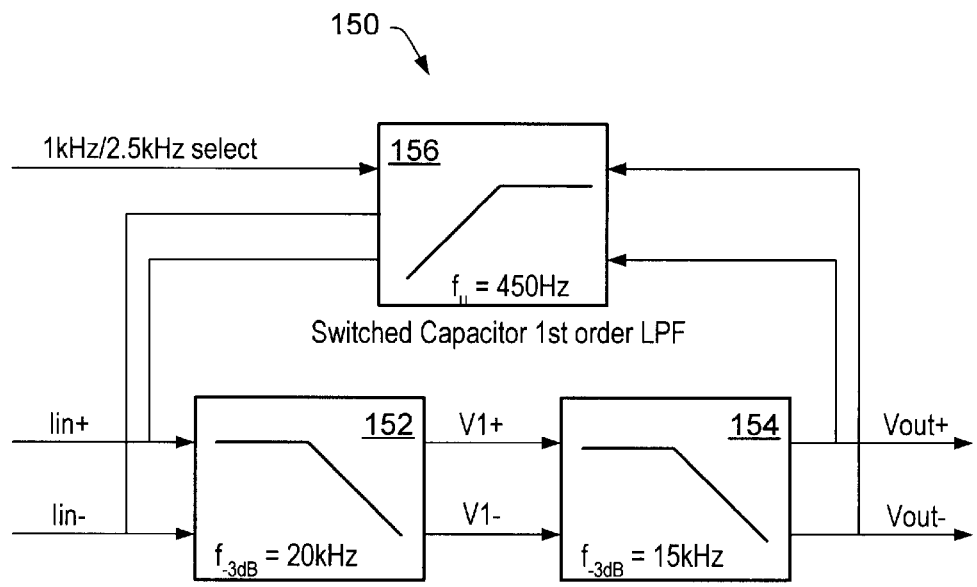
FIG. 3 is a block diagram of one embodiment of a hybrid filter circuit.
Figure 3:
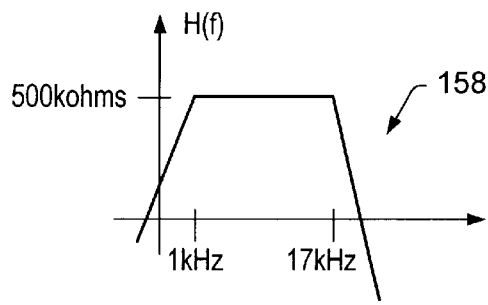

FIG. 3 is a block diagram of one embodiment of a hybrid filter circuit. In the embodiment shown, hybrid filter circuit includes CT filter 152, SWC filter 154, and SWC integrator 156. SWC integrator 156 is coupled in a feedback path between the output of SWC filter 154 and the input of CT filter 152.

For the purposes of this disclosure, the term "continuous time" filter may refer to any filter that performs a filtering function without the need of switching circuits (e.g., a simple resistor-capacitor combination that performs a low-pass filtering function). The term "switched capacitor" used herein in reference to SWC filter 154 and SWC integrator 156 may refer to any type of filtering or integrator in which a capacitor function may be switched in and out of the circuit.

CT filter 152 may be coupled to receive a differential input signal from another unit, such as down-conversion mixer 140 shown in FIG. 2 (although single-ended embodiments are possible and contemplated). In one embodiment, CT filter may be a low pass filter, although other embodiments are possible and contemplated. The response of CT filter may be based on resistive-capacitive (RC) time constants, and the corner frequency of the filter response may vary over time. CT filter may also provide an anti-aliasing function, which may aid in recovery of the intended information from the received signal. In this particular example, CT filter 152 has a corner frequency of about 20 kHz, although the approximate corner frequency may be varied to meet the needs of the specific application.

In the embodiment shown, SWC filter 154 may receive a differential signal conveyed from CT filter 152. SWC filter 154 may also be a low pass filter, but may have a more tightly controlled corner frequency than CT filter 152, and may thus perform a more accurate filtering function. In this particular example, SWC filter 154 has a corner frequency of approximately 15 kHz. SWC filter 154 may provide an information signal as an output.

SWC integrator 156 may be coupled to sample the information signal that is output by SWC filter 154. In this particular example, SWC integrator may be coupled to receive a selectable control signal which chooses a zero frequency of either 1 kHz or 2.5 kHz. The zero frequency is controlled by changing the gain, or integration constant, or the SWC integrator. SWC integrator 156 may introduce a low-frequency zero into the transfer function that describes the signal relationship between the input and the output of hybrid filter 150. The low-frequency zero is preferably such that it eliminates or substantially reduces any D.C. offset without affecting any information present in the signal that is to be recovered.

The output of SWC integrator 156 is coupled to the input of CT filter 152. In one embodiment, the output signal may be provided via a voltage-to-current converter. In another embodiment, the SWC integrator output may be coupled to the CT filter input by means of resistors, which also perform a voltage to current conversion function. The output signal may be combined with the input signal to the CT filter that is received from a mixer, such as down-conversion mixer 140 of FIG. 2. Dependent upon the D.C. gain of SWC integrator 156, the combining of the input signal to CT filter 152, and the continuous output signal provided by SWC integrator 156, D.C. offset may be substantially reduced or eliminated from the entire filter structure. Thus, the information conveyed by the information signal output from SWC filter 154 may be successfully recovered.

An approximate response of hybrid filter 150 is shown in item 158. The response overall results in a bandpass filter with upper and lower corner frequencies. The filter response below the lower corner frequency includes the D.C. portion of the spectrum, and thus the filter may eliminate or substantially reduce D.C. offset from the information signal output by hybrid filter 150.

Figure 4A:
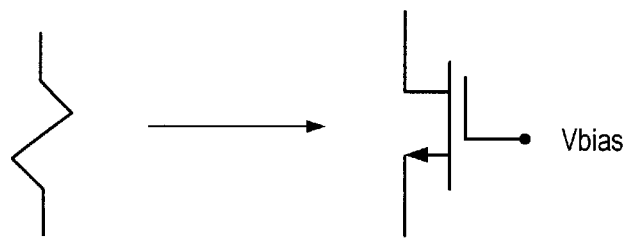
FIG. 4A is a diagram illustrating the use of transistors to implement resistors and capacitors for one embodiment.
Figure 4A:
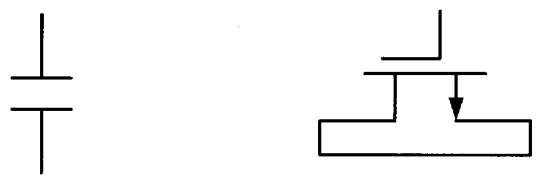

FIG. 4A is a diagram illustrating the use of transistors to implement resistors and capacitors for one embodiment of hybrid filter 150. In this particular example, a resistor may be implemented between the source and the drain of a field effect transistor (FET). A biasing voltage applied to the gate of the FET may allow current to flow between the source and the drain. The specific resistance provided may be varied by varying the size of the transistor during fabrication of the circuit, or by changing the bias voltage applied to the gate of the transistor.

A capacitor is also implemented using a FET in this particular example. Specifically, the source and the drain of the FET may be coupled together. A charge may be developed between the gate terminal and the coupled source and drain terminals, thereby providing the necessary capacitance. As with the resistor implementation, the value of the capacitor formed may be varied at the time of circuit fabrication by varying the size of the transistor.

Figure 4B:
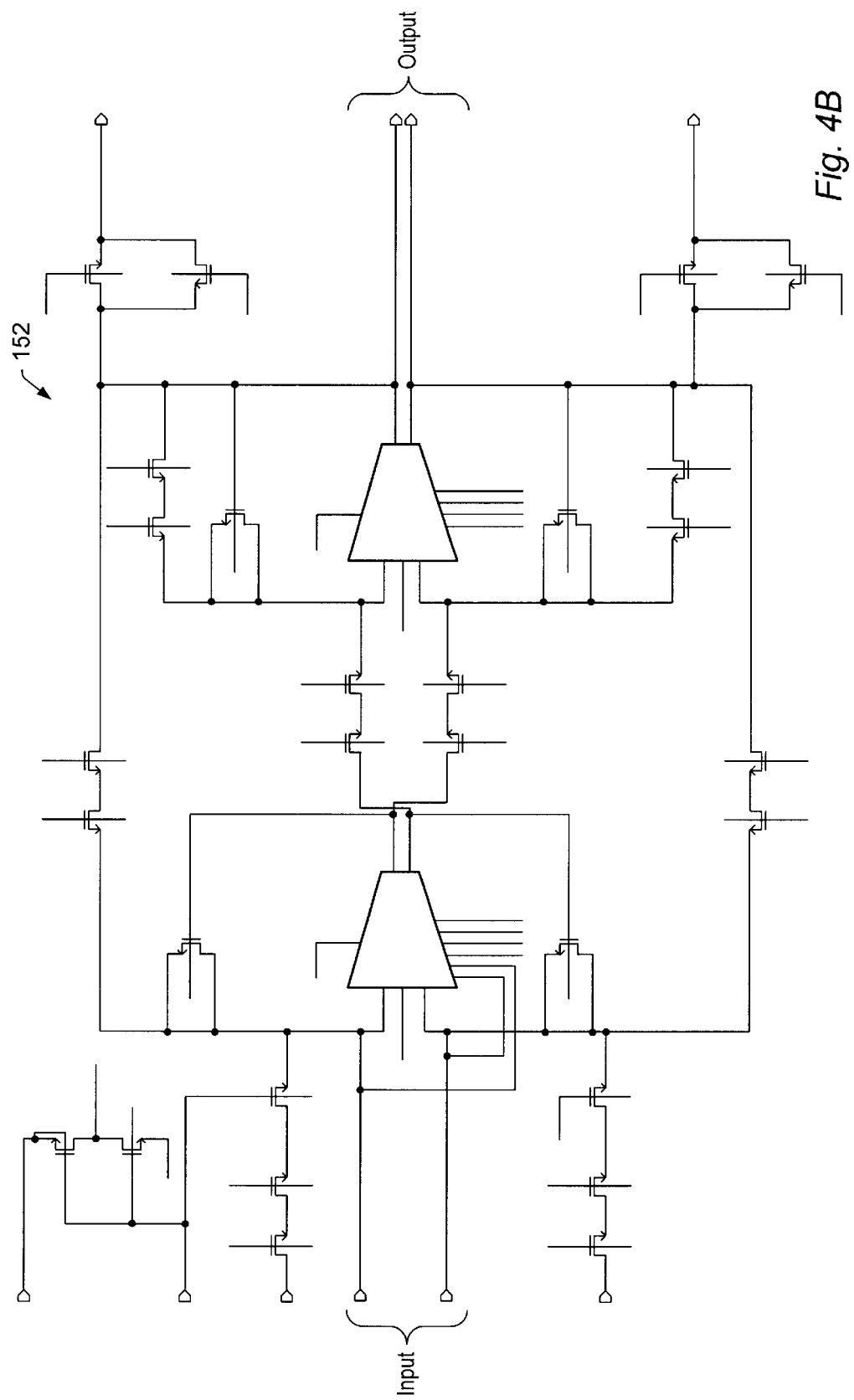
FIG. 4B is a schematic diagram of one embodiment of a continuous time filter used in the hybrid filter circuit.

FIG. 4B is a schematic diagram of one embodiment of a continuous time filter used in the hybrid filter circuit. In the embodiment shown, CT filter 152 is coupled to receive a differential input signal and provide a differential output signal. Resistors and capacitors may be implemented in CT filter 152 as shown above in FIG. 4A in order to provide the necessary RC time constant(s) to implement the filtering function. The embodiment shown here performs as a low pass filter, although other embodiments are possible and contemplated.

Figure 5A:
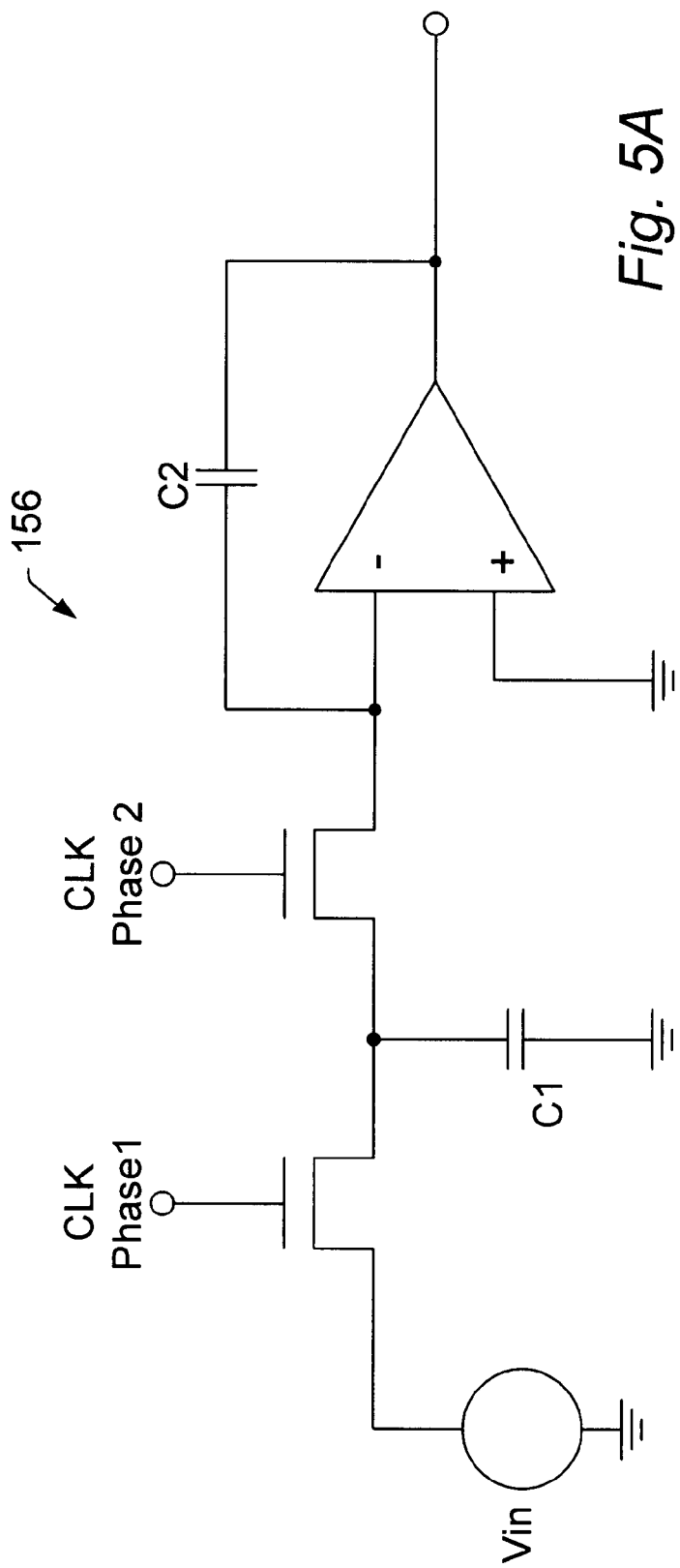
FIG. 5A is a schematic diagram of one embodiment of a basic switched capacitor integrator.

FIG. 5A is a schematic diagram of one embodiment of a basic switched capacitor integrator. The embodiment shown here is for demonstration purposes in order to explain the function of an SWC filter. SWC integrator 156 may be coupled to receive an input signal, provided here by voltage source Vin. The signal may also be received from other sources. A pair of transistors in SWC integrator may be coupled to switch on or off on alternating clock cycles of a non-overlapping two-phase clock signal. During clock phase 1, the first transistor may be switched on while the second transistor is switched off. This may allow capacitor C1 to charge to voltage Vin. During clock phase 2, the first transistor may be switched off while the second transistor is switched on. When the first transistor is off and the second transistor is switched on, capacitor C1 may discharge, thereby charging C2, of which one terminal is coupled to the output of the operational amplifier. The output signal from SWC integrator 156 may be provided from the junction connecting the terminal of C2 and the operational amplifier output. The shape of the output signal may be determined by the frequency of the clock which alternately switches on the first and second transistors.

Figure 5B:
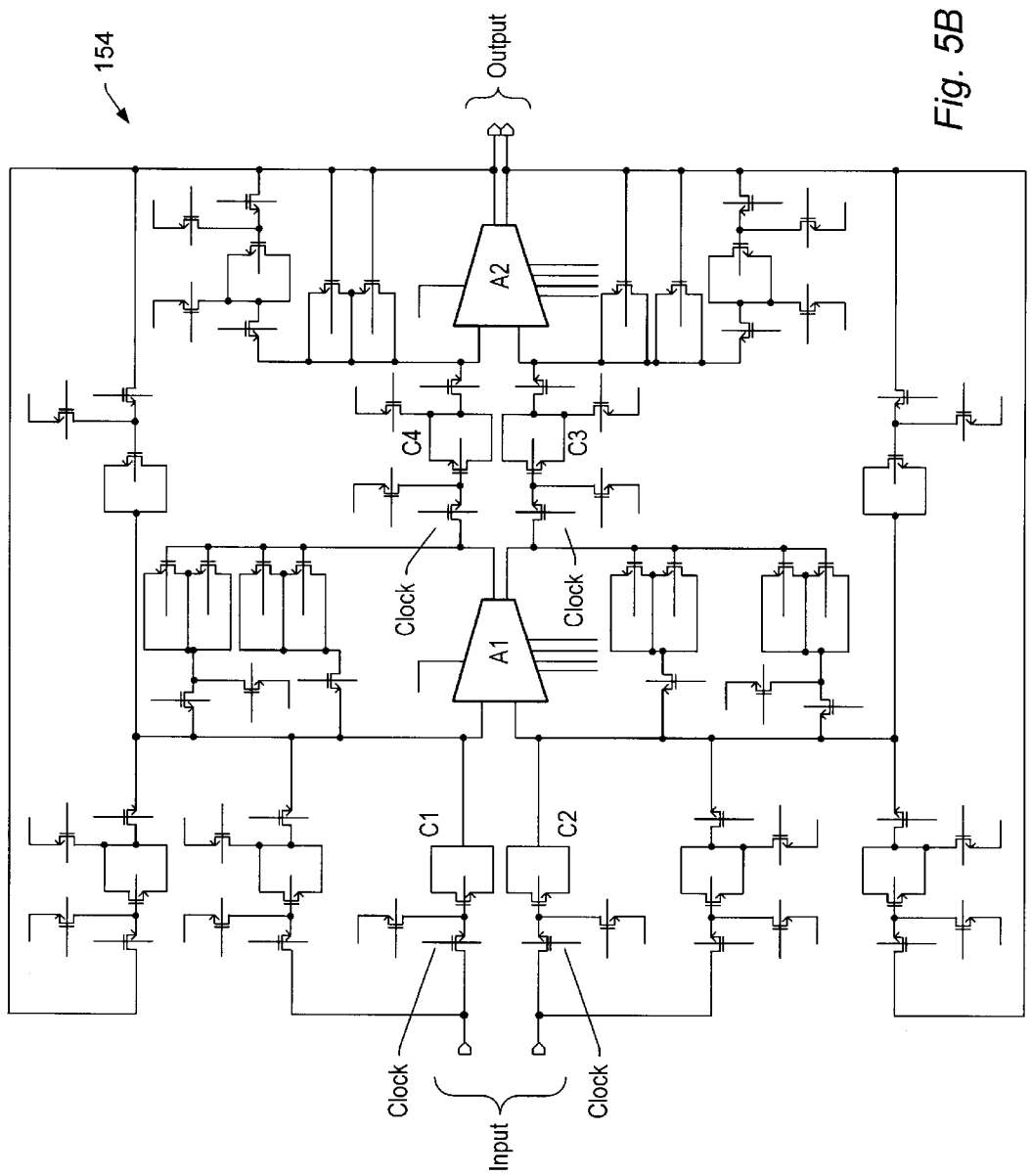
FIG. 5B is a schematic diagram of one embodiment of a switched capacitor filter used in the hybrid filter circuit.

FIG. 5B is a schematic diagram of one embodiment of a switched capacitor filter used in the hybrid filter circuit. SWC filter 154 may work on a similar principle to the SWC integrator shown above in FIG. 5A. This particular embodiment of SWC filter 154 may be coupled to receive a differential input signal and provide a differential output signal. As with the example above, a non-overlapping two-phase clock may switch transistors on and off. The differential signal received at the input of SWC filter 154 may charge capacitors C1 and C2 (as well as other capacitors in the signal path) during clock phase 2. During clock phase 1, capacitors C1 and C2 may discharge into the feedback capacitors of the first amplifier A1. A differential output signal from amplifier A1 may charge capacitors C3 and C4. Capacitors C3 and C4 may discharge into the feedback capacitors of amplifier A2, which may then drive a differential signal from SWC filter 154 through its differential output.

Figure 6:
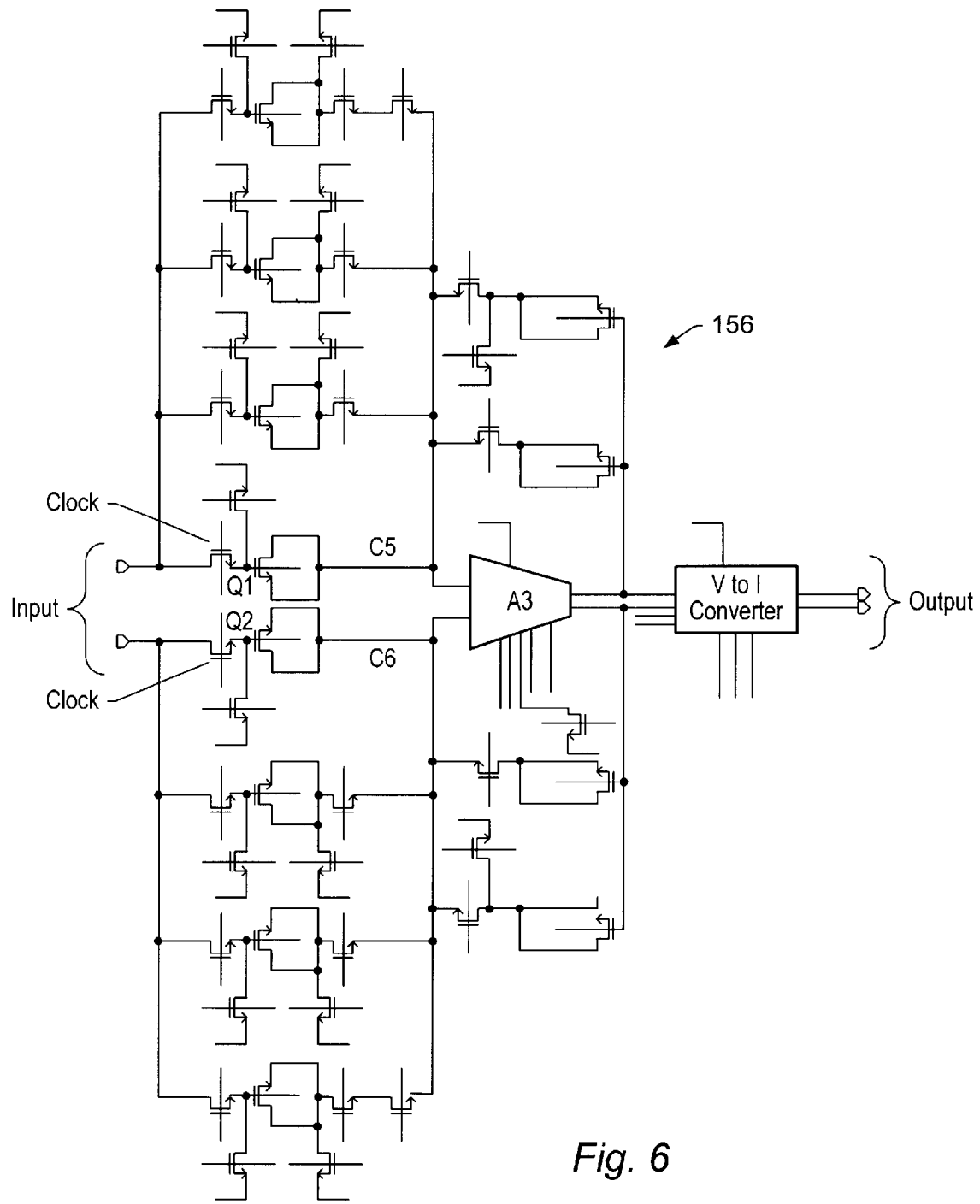
FIG. 6 is a schematic diagram of one embodiment of an integrator used in the hybrid filter circuit.

FIG. 6 is a schematic diagram of one embodiment of an integrator used in the hybrid filter circuit. SWC integrator 156 is coupled to sample a differential input signal at its input terminals. A clock signal may switch on transistors Q1 and Q2 during one of its phases. Capacitors C5 and C6 may charge during the clock phase in which transistors Q1 and Q2 are turned on. One terminal each of capacitors C5 and C6 may be coupled to the input terminals of amplifier A3. Amplifier A3 may drive differential voltage signals to the voltage-to-current converter, which may in turn drive current signals from SWC integrator 156.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A filter circuit comprising:
   a continuous time (CT) filter coupled to receive an input signal, wherein the CT filter is a low-pass filter;
   a switched capacitor (SWC) filter, the SWC filter coupled to receive an output signal from the CT filter and provide an information signal as an output; and
   a SWC integrator, wherein the SWC integrator is coupled in a feedback loop between an output of the SWC filter and an input of the CT filter, and wherein the SWC integrator is configured to sample the information signal output by the SWC filter and provide a output signal to the input of the CT filter;
   wherein the input signal to the CT filter is combined with the output signal from the SWC integrator, and wherein a DC (direct current) component is substantially removed from the information signal responsive to combining the input signal to the CT filter with the output signal.

2. The filter circuit as recited in claim 1, wherein the filter circuit is implemented on a single die.

3. The filter circuit as recited in claim 1, wherein the CT filter provides an anti-aliasing function.

4. The filter circuit as recited in claim 1, wherein the SWC filter is a low-pass filter.

5. The filter circuit as recited in claim 1, wherein the SWC integrator implements a low-frequency zero function.

6. The filter circuit as recited in claim 1, wherein a response of the CT filter is based on an RC (resistive-capacitive) time constant.

7. The filter circuit as recited in claim 6, wherein the CT filter includes at least one resistor and at least one capacitor.

8. The filter circuit as recited in claim 7, wherein the resistor and the capacitor are implemented using transistors.

9. The filter circuit as recited in claim 1, wherein the SWC integrator includes a voltage-to-current (V-I) converter.

10. The filter circuit as recited in claim 1, wherein the input signal to the CT filter, the output signal from the SWC integrator, and the information signal are differential signals.

11. A method for rejecting a DC (direct current) offset in a filter circuit, the method comprising:
    providing an input signal to a continuous time (CT) filter;
    performing a CT filtering function, wherein the continuous time filter is a low-pass filter;
    providing output from CT filter to input of a switched capacitor (SWC) filter;
    performing a SWC filtering function;
    sampling, with an SWC integrator, an information signal output by the SWC filter, wherein the SWC integrator is coupled in a feedback loop between an the output of the SWC filter and an input of the CT filter;
    providing a output signal from the SWC integrator and combining the output signal with the input signal to the CT filter, wherein a DC (direct current) component is substantially removed from the information signal responsive to said combining.

12. The method as recited in claim 11 further comprising performing an anti-aliasing function in the CT filter.

13. The method as recited in claim 11, wherein the SWC filter is a low-pas filter.

14. The method as recited in claim 11 further comprising implementing a low-frequency zero function in the SWC integrator.

15. The method as recited in claim 11, wherein a response of the CT filter is based on an RC (resistive-capacitive) time constant.

16. The method as recited in claim 15, wherein the CT filter includes at least one resistor and at least one capacitor.

17. The method as recited in claim 16, wherein the resistor and the capacitor are implemented using transistors.

18. The method as recited in claim 11, wherein the input signal to the CT filter, the output signal from the SWC integrator, and the output signal provided by the SWC filter are differential signals.

19. The method as recited in claim 11, wherein the filter circuit is implemented on a single die.

20. A direct conversion receiver circuit comprising:
- a mixer, wherein the mixer is coupled to receive a radio frequency signal input and to provide a baseband signal output;
- a filter circuit, wherein the filter circuit is coupled to receive the baseband output signal from the mixer, wherein the filter circuit is configured to output an information signal, wherein the filter circuit includes:
- a continuous time (CT) filter coupled to receive the baseband signal, wherein the CT filter is a low-pass filter;
- a switched capacitor (SWC) filter, the SWC filter coupled to receive an output signal from the CT filter and further configured to output an information signal, wherein the SWC filter is a low-pass filter; and
- a SWC integrator, wherein the SWC integrator is coupled in a feedback loop between an output of the SWC filter and an input of the CT filter, and wherein the SWC integrator is configured to sample the information signal and provide an output signal to the input of the CT filter;
- wherein the baseband signal is combined with the output signal from the SWC integrator at the input to the CT filter, and wherein a DC (direct current) component is substantially removed from the information signal responsive to combining the baseband signal with the output signal.

* * * * *

UNITED STATES PATENT AND TRADEMARK OFFICE
CERTIFICATE OF CORRECTION

PATENT NO.     : 6,703,894 B1
DATED          : March 9, 2004
INVENTOR(S)    : Troy L. Stockstad and Klaas Wortel It is certified that error appears in the above-identified patent and that said Letters Patent is hereby corrected as shown below:

<u>Column 6,</u>
Line 58, please delete "an the output" and substitute -- the output --;

<u>Column 7,</u>
Line 2, please delete "low-pas" and substitute -- low-pass --.

Signed and Sealed this

Twenty-second Day of June, 2004

JON W. DUDAS
*Acting Director of the United States Patent and Trademark Office*